United States Patent
Tan

(10) Patent No.: US 6,882,014 B2
(45) Date of Patent: Apr. 19, 2005

(54) PROTECTION CIRCUIT FOR MOS COMPONENTS

(75) Inventor: Chih-Ping Tan, Taipei (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 386 days.

(21) Appl. No.: 09/930,204

(22) Filed: Aug. 16, 2001

(65) Prior Publication Data

US 2002/0130368 A1 Sep. 19, 2002

(30) Foreign Application Priority Data

Mar. 14, 2001 (TW) .......................... 90105923 A

(51) Int. Cl.[7] .......................... G01R 31/04; G01R 31/02
(52) U.S. Cl. .......................... 257/369; 257/355; 257/630; 257/356; 257/529; 257/528; 257/532; 324/750; 455/83; 363/126; 333/104; 330/310
(58) Field of Search .................................. 257/369, 355, 257/630, 356, 529, 528, 532; 324/750; 455/83; 363/126; 333/104; 330/310

(56) References Cited

U.S. PATENT DOCUMENTS

| 4,929,887 A | * | 5/1990 | Robitaille et al. ............ 324/66 |
| 6,537,883 B1 | * | 3/2003 | Chen et al. .................. 438/281 |
| 2002/0153593 A1 | * | 10/2002 | Chen et al. .................. 257/630 |

* cited by examiner

Primary Examiner—Alexander Oscar Williams
(74) Attorney, Agent, or Firm—Birch, Stewart, Kolasch & Birch, LLP

(57) ABSTRACT

A protection circuit for MOS components. In the protection circuit, a bypass PMOS transistor has a gate, a source and a substrate, all coupled to a first voltage node and a drain coupled to a gate of a MOS component. A bypass NMOS transistor has a gate, a source and a substrate, all coupled to a second voltage node and a drain coupled to the gate of the MOS component. When positive charges are accumulated on the gate of the MOS component due to an antenna effect, the bypass PMOS transistor dissipates the positive charges to the first voltage node. On the contrary, when negative charges are accumulated on the gate of the MOS component due to antenna effect, the bypass NMOS transistor dissipates the negative charges to the second voltage node.

1 Claim, 3 Drawing Sheets

PROTECTION CIRCUIT FOR MOS COMPONENTS

This nonprovisional application claims priority under 35 U.S.C. §119(a) on Patent Application No(s). 090105923 filed in Taiwan, R.O.C. on Mar. 14, 2001, the entire contents of which are hereby incorporated by reference.

BACKGROUND OF THE INVENTION

1. Field of the Invention

The present invention relates in general to a method to protect MOS components and the apparatus thereof. In particular, the present invention relates to a method to protect MOS components from antenna effect and the apparatus thereof.

2. Description of the Related Art

During plasma etching, damaging induced by plasma to the MOS component are referred to as plasma charging damaging, or antenna effect. Due to the uneven distribution characteristics of charges in plasma, charges are accumulated on the conductors (such as: polysilicon or aluminum alloys) with large surface areas or long sides. The charges generate an electric field on the gate oxide layer of the MOS component. When enough charges are collected, the electric field across the gate oxide layer changes the properties of the MOS component. More severe damage may occur if the current is high enough to pass through the gate oxide layer.

FIG. 1 shows a conventional circuit design using a diode to reduce the antenna affect. In FIG. 1, T1 is a MOS component in an integrated circuit (IC), the substrate (or bulk) B of the MOS is coupled to its own source, or to a fixed power rail (VDD or VSS). The diode D1 has its anode coupled to the substrate of the IC. It is assumed that the conductive line L1 connected with the gate of the MOS component T1 has a very large surface area or periphery length. Due to the plasma characteristics, a large amount of charges is accumulated on the conductive line L1, causing the antenna affect (as the antenna Ana shown in FIG. 1).

If the accumulated charges are negative charges, the diode D1 provides a discharge path to release the negative charges to the substrate sub1 of the IC, preventing damaging made to the gate oxide layer of the MOS component T1. However, when the accumulated charges are positive charges, no discharge path exists. The electric field across the gate oxide layer thus degrades the layer. Moreover, the large stray capacitance of the diode D1 compromises the operating rate of the IC circuit, resulting in slower operating speeds.

FIG. 2 shows a conventional circuit design using a transmission gate to reduce the antenna effect. In FIG. 2, the conductive line L2 connected to the gate of the MOS component T2 has very a large area or is very long. Due to the plasma distribution characteristics, large amounts of charges are accumulated on the conductive line L2, causing the antenna effect (as the antenna Ana shown in FIG. 2). Herein, T2 is the MOS component of a IC circuit with its substrate B connected to the source or a fixed power rail (VDD or VSS).

To reduce the antenna effect, a transmission gate is placed in the IC circuit in FIG. 2 and coupled with the gate of the MOS component T2. In the NMOS transistor NT of the transmission gate, the gate and the substrate are respectively coupled to the nodes VDD and VSS In the PMOS transistor PT of the transmission gate, the gate and the substrate are respectively coupled to the nodes VSS and VDD. Irrespective of whether the accumulated charges in the antenna effect are of either of the bias polarities, they are discharged through the parasitic diodes between the source/drain and the substrate of the NMOS transistor NT (or PMOS transistor PT) to prevent the MOS component T2 from degradation.

Because the transmission gate is located on the path for controlling the gate of the MOS component T2, and the transmission gate has parasitic capacitor C and resistance R, the RC constant will lead to the delay of the control signal sent to the gate of T2 and compromise the operating rate of the MOS component T2. To enhance the operating rate of the MOS component T2, resistance R is expected to be reduced. The easiest way to reduce the resistance R is to cut the channel length or increase the channel width of the transmission gate. However, by doing so, the capacitance C is simultaneously increased. Therefore, it is awkward to reduce the antenna effect by adjusting the R and C values according to the configuration in FIG. 2.

SUMMARY OF THE INVENTION

An object of the present invention is to provide an apparatus for protecting an MOS component from the antenna effect. The apparatus comprises a bypass PMOS transistor whose gate, source and substrate are coupled to a first voltage node, and that, when positive charges are accumulated on the gate of the MOS component due to antenna effect, conveys the positive charges to the first voltage node to prevent them from entering and damaging the MOS component; and a bypass NMOS transistor, whose gate, source and substrate are coupled to a second voltage node, and that, when negative charges are accumulated on the gate of the MOS component due to the antenna effect, conveys the negative charges to the second voltage node to prevent them from entering and damaging the MOS component.

Another object of the present invention is to provide a method for protecting an MOS component from antenna effect. The method comprises disposal, between a first voltage node and the MOS component, of a bypass PMOS transistor, the gate, source and substrate of which are coupled to the first voltage node and the drain of which is coupled to the gate of the MOS component; and disposal, between a second voltage node and the MOS component, of a second bypass NMOS transistor, the gate, source and substrate of which are coupled to the second voltage node and the drain of which is coupled to the gate of the MOS component.

When positive charges accumulate on the gate of the MOS component due to the antenna effect, the bypass PMOS transistor conveys the positive charges to the first voltage node to prevent them from entering and damaging the MOS component. When the negative charges accumulate on the gate of the MOS component due to the antenna effect, the bypass NMOS transistor conveys the negative charges to the second voltage node to prevent them from Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description. entering and damaging the MOS component.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE PREFERRED EMBODIMENT

Figure 3:
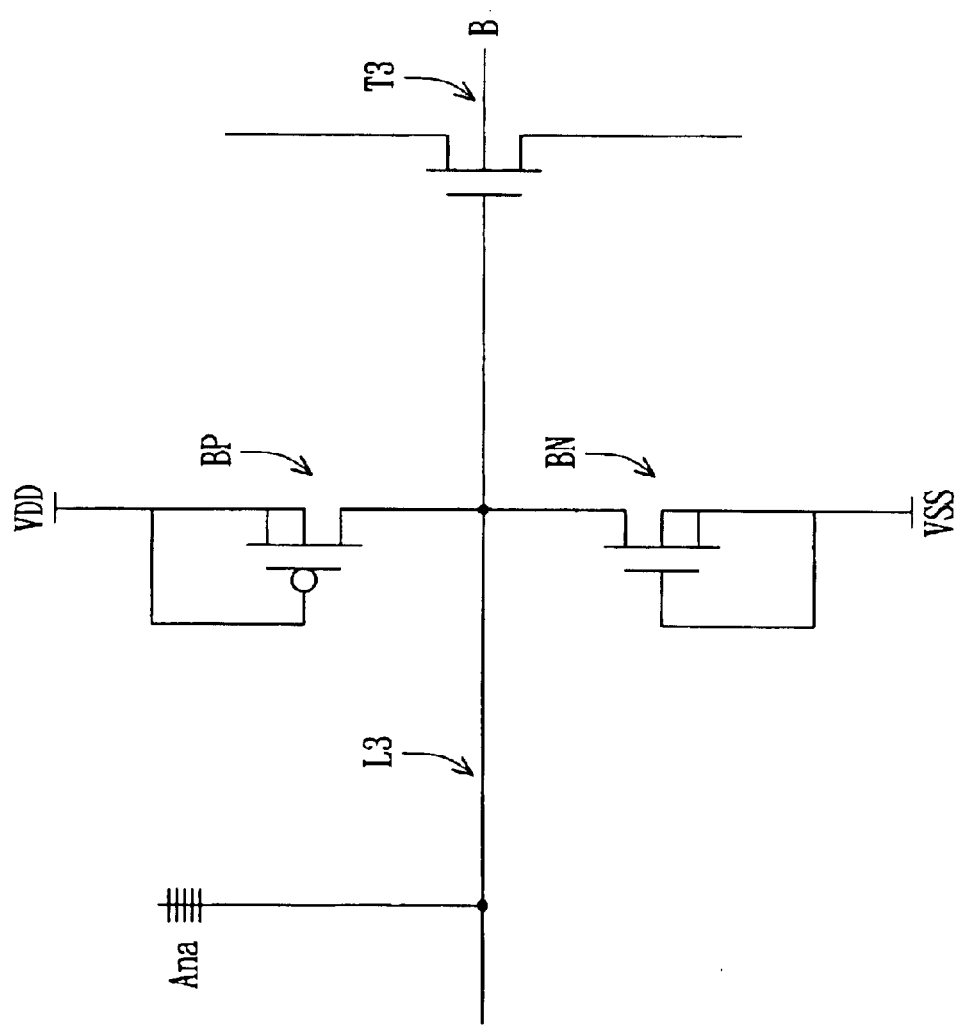
FIG. 3 shows the embodiment of the present invention for reducing the antenna effect.

FIG. 3 shows a circuit of the embodiment of the present invention to reduce the antenna effect.

FIG. 3 shows the embodiment of the present invention for reducing the antenna effect (as the antenna Ana shown in FIG. 3).

(1) The disposal, between a first voltage node VDD and the MOS component T3, of a bypass PMOS transistor BP, the gate, source and substrate of which are coupled to the first voltage node VDD and the drain of which is coupled to the gate of the MOS component T3; and (2) Disposal, between a second voltage node VSS and the MOS component T3, of a bypass NMOS transistor BN, the gate, source and substrate of which are coupled to the second voltage node VSS, and the drain of which is coupled to the gate of the MOS component T3.

Referring to FIG. 3, according to the method described, the following apparatus is proposed for protecting an MOS component from the antenna effect, the apparatus comprising:

(1) a bypass PMOS transistor BP, the gate, source and the substrate of which are coupled to a first voltage node VDD, and the stray diode of which, when positive charges are accumulated on the gate of the MOS component due to the antenna effect, conveys the positive charges to the first voltage node VDD to prevent the positive charges from entering and damaging the gate oxide layer of the MOS component T3; and (2) a bypass NMOS transistor BN, the gate, source and substrate of which are coupled to a second voltage node VSS, and the stray diode of which, when the negative charges are accumulated on the gate of the MOS component T3 due to the antenna effect, conveys the negative charges to the second voltage node VSS to prevent them from entering and damaging the gate oxide layer of the MOS component T3.

Therefore, the present invention has the following advantages:

(1) Conveyance of the positive charges accumulated through the antenna effect to the voltage node VDD via the bypass PMOS transistor BP; and of the negative charges accumulated through the antenna effect to the voltage node VSS via the bypass NMOS transistor NP. Thus, the present invention neutralizes the accumulated charges of either polarity.

Figure 1:
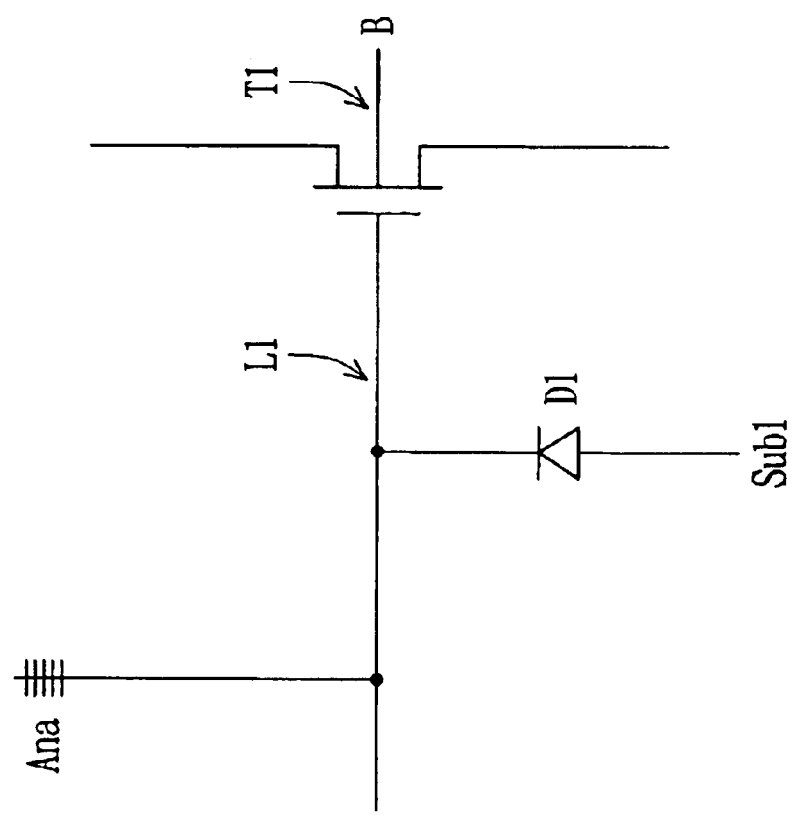
FIG. 1 is a perspective diagram of a conventional circuit using a diode to reduce the antenna effect.
Figure 2:
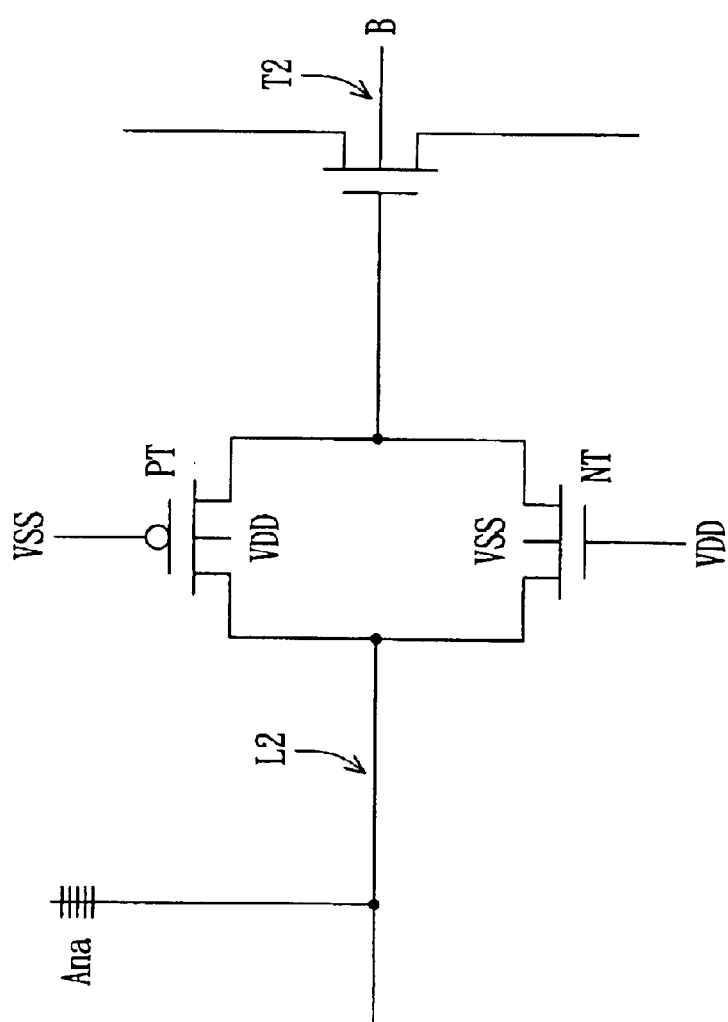
FIG. 2 is a perspective diagram of a conventional circuit using a transmission gate to reduce the antenna effect.

(2) The present invention uses bypass NMOS and PMOS transistors, wherein the stray capacitances are between the drains and substrates of the bypass transistors. Compared to the transmission gate in FIG. 2, the design of the present invention reduces the parasitic capacitance substantially, and the resistance referred in FIG. 2 is omitted. Thus the operating rate of the protected component is enhanced.

(3) The bypass NMOS and PMOS transistors in the present invention enhance the compatibility of IC circuit with MOS process with other MOS component.

Finally, while the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A protection circuit for a MOS component comprising:
    a bypass PMOS transistor, having a gate, a source and a substrate, all coupled to a first voltage node and a drain coupled to a gate of the MOS component;
    a bypass NMOS transistor, having a gate, a source and a substrate, all coupled to a second voltage node and a drain coupled to the gate of the MOS component;
    wherein when positive charges are accumulated on the gate of the MOS component due to antenna effect, the bypass PMOS transistor dissipates the positive charges to the first voltage node; and when the negative charges are accumulated on the gate of the MOS component due to antenna effect, the bypass NMOS Transistor dissipates the negative charges to the second voltage node.

* * * * *